United States Patent [19]

Mack et al.

[11] Patent Number: 5,689,516

[45] Date of Patent: Nov. 18, 1997

[54] RESET CIRCUIT FOR A PROGRAMMABLE LOGIC DEVICE

[75] Inventors: Ronald J. Mack, Gilroy; Derek R. Curd, San Jose; Sholeh Diba, Los Gatos; Napoleon W. Lee, Milpitas; Kameswara K. Rao; Mihai G. Statovici, both of San Jose, all of Calif.

[73] Assignee: Xilinx, Inc., San Jose, Calif.

[21] Appl. No.: 670,916

[22] Filed: Jun. 26, 1996

[51] Int. Cl.[6] .................................................. G06F 11/00
[52] U.S. Cl. ................................................... 371/22.2
[58] Field of Search ............................. 371/22.3, 22.1, 371/22.6, 22.2, 22.5; 324/73 R, 158 R

[56] References Cited

U.S. PATENT DOCUMENTS

| 5,598,421 | 1/1997 | Tran et al. | 371/22.3 |
| 5,610,927 | 3/1997 | Segars | 371/22.3 |
| 5,617,431 | 4/1997 | Topuri et al. | 371/22.3 |
| 5,623,502 | 4/1997 | Wang | 371/22.3 |

OTHER PUBLICATIONS

"The Programmable Logic Data Book", 1994, pp. 3-1 through 3-90, available from Xilinx, Inc., 2100 Logic Drive, San Jose, CA 95124.

*Primary Examiner*—Vincent P. Canney
*Attorney, Agent, or Firm*—Arthur J. Behiel; Edel M. Young

[57] ABSTRACT

A programmable logic device (PLD) includes test circuitry compatible with the JTAG standard (IEEE Standard 1149.1). The PLD also includes a programmable JTAG-disable bit that can be selectively programmed to disable the JTAG circuitry, leaving the PLD to operate as a conventional, non-JTAG-compatible PLD. The PLD also includes means for testing the JTAG test circuitry to determine whether the JTAG circuitry is defective, and means for programming the JTAG-disable bit to disable the JTAG circuitry if the testing means determines that the JTAG circuitry is defective.

10 Claims, 6 Drawing Sheets

RESET CIRCUIT FOR A PROGRAMMABLE LOGIC DEVICE

BACKGROUND

1. Field of the Invention

This invention relates generally to programmable logic devices, and particularly to a programmable logic device that includes JTAG test circuitry.

2. Description of Related Technology

PLDs are a well-known type of integrated circuit (IC) and are of wide applicability due to the flexibility provided by their reprogrammable nature. A typical PLD includes an array of identical function blocks programmably connected to one another via a universal interconnect matrix (UIM). Input signals are transmitted to the UIM from device input pins and are routed by the UIM to the function blocks, and output signals are transmitted to device output pins from the UIM.

Each function block includes an AND array and a number of macrocells. Within each function block, the AND array receives input signals from the UIM and provides product terms to the macrocells, each including an OR gate that produces an output signal based on selected product terms from the AND array. The output signals generated by the macrocells are then either fed back to the UIM or transmitted to an output pin of the PLD as an output signal. PLDs that include the above-described circuit structure are described in more detail in Section 3, pages 3-1 to 3-90, of *The Programmable Logic Data Book* (1994) published by Xilinx, Inc., which is incorporated herein by reference.

The function blocks and UIM are programmed to provide logic functions desired by a "user" (e.g., a circuit designer). To accomplish such programming, the function blocks and the UIM each include an array of programmable memory cells, such as flash transistor storage cells, that are programmed to specify a desired logic function. Individual function blocks can be programmed to provide distinct logic functions, or the function blocks and UIM can be collectively programmed to provide more complex logic functions. Then, when the PLD is powered up, a counter (e.g., a state machine) sequentially addresses the programmable cells and loads the program data stored therein into corresponding cells in an array of RAM cells (i.e., "configuration bit cells"). The data stored in the configuration bit cells then determines the function of the PLD. This process of loading the RAM array with the program data (i.e., "configuring" the PLD) is well known.

As with many conventional ICs, some PLDs contain JTAG test circuitry, which is conventionally used to verify the integrity of traces connecting components on an assembled printed circuit board. The JTAG test standard was developed by the Joint Test Action Group (JTAG), the technical subcommittee that developed the JTAG standard. All vendors claiming conformance to the JTAG standard (IEEE Standard 1149.1) support a set of mandatory "public" instructions.

In ICs that include JTAG test circuitry (i.e., circuitry that conforms to IEEE Standard 1149.1), the principal function of the device is typically unrelated to the JTAG test functions. For example, a JTAG-compatible PLD does not rely on JTAG instructions to perform its principal function as a logic device. However, when testing JTAG-compatible ICs, defective JTAG test circuitry can cause a test procedure to reject the entire IC as defective. Unfortunately, this results in the disposal of ICs that, though having defective JTAG circuitry, might nevertheless be useful for performing their principal function. Thus, there exists a need for an IC, such as a PLD, in which the JTAG test circuitry is tested separately from the remaining circuitry. Further, there exists a need for an IC with a means for disabling defective JTAG circuitry without affecting the principal function provided by the remaining circuitry.

SUMMARY OF THE INVENTION

A PLD in accordance with the present invention includes separately testable JTAG circuitry and a mechanism for disabling defective JTAG circuitry without affecting the functionality of the remaining PLD circuitry.

The inventive PLD includes JTAG test circuitry configured to receive JTAG test instructions on a conventional JTAG instruction port. As with conventional PLDs, the inventive PLD also includes arrays of programmable memory elements that are programmed to provide logic functions. However, in accordance with the present invention, the memory array includes a programmable JTAG disable bit that, when programmed, disables the JTAG test circuitry.

By separately testing the functionality of the JTAG test circuitry and that of the remaining PLD circuitry (i.e., the "standard" circuitry), a test engineer determines whether either of the JTAG circuitry or standard circuitry is defective. If the standard circuitry is defective, the PLD is rejected; if the standard circuitry is functional but the JTAG circuitry is defective, the JTAG disable bit is set and the PLD is classified as a standard (i.e., non-JTAG compatible) PLD; finally, if neither the standard nor the JTAG circuitry is defective, the PLD is classified as a fully functional, JTAG-compatible PLD. Thus, the present invention allows manufacturers to make use of PLDs that otherwise would have been discarded as defective.

BRIEF DESCRIPTION OF THE FIGURES

These and other features, aspects, and advantages of the present invention will become understood with regard to the following description, appended claims, and accompanying figures, where:

DETAILED DESCRIPTION OF THE DRAWINGS

Figure 1:
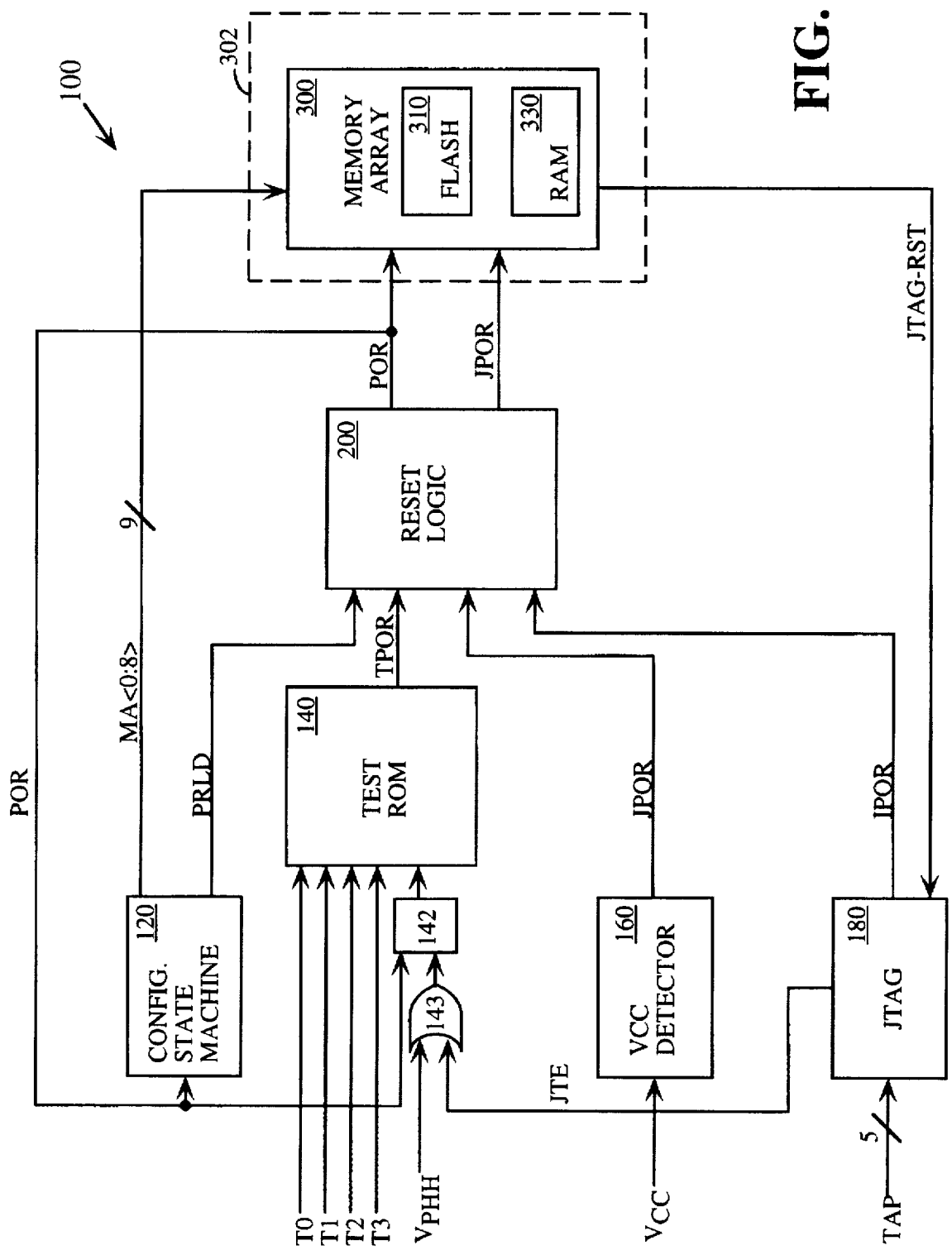
FIG. 1 is a block diagram of a PLD 100 in accordance with the present invention.

FIG. 1 is a block diagram of a PLD 100 in accordance with the present invention. PLD 100 includes a conventional configuration state machine 120, a test ROM 140, a $V_{CC}$ detector 160, and conventional JTAG test circuitry 180, all of which are connected via reset logic 200 to a memory array 300 in a function block 302. Reset logic 200 is described in detail in connection with FIGS. 2A and 2B.

JTAG test circuitry 180 is conventionally used to verify the integrity of traces connecting PLD 100 with other JTAG-compatible components on an assembled printed circuit board. To provide the necessary compatibility, JTAG test circuitry 115 is e.g. fully compliant with the IEEE Standard 1149.1 Test Access Port and Boundary-Scan Architecture, commonly referred to as the "JTAG standard," or simply "JTAG." For a more detailed discussion of JTAG test circuit 180, see the commonly owned patent applications entitled "Circuit For Partially Reprogramming an Operational Programmable Logic Device," by Napoleon W.

Lee, Derek R. Curd, Jeffrey H. Seltzer, Jeffrey Goldberg, David Chiang, and Kameswara K. Rao, Ser. No. 8/670,472 (attorney docket number X-171); and "Efficient In-System Programming Structure and Method for Non-Volatile Programmable Logic Devices," by Derek R. Curd, Kameswara K. Rao, and Napoleon W. Lee, Ser. No. 08/512,796, filed 9 Aug. 1995 (attorney docket number X-184); both of which are incorporated herein by reference.

Memory array 300 includes a flash array 310 and a RAM array 330 that conventionally determine the configuration of function block 302. That is, RAM array 330 is loaded (i.e., configured) with program data from flash array 310. Other memory arrays corresponding to each of the remaining function blocks and the UIM of PLD 100 are similar and are therefore omitted for simplicity. Memory array 300 is described in detail in connection with FIG. 3.

Configuration state machine 120 is connected to memory array 300 via a memory-access bus MA<0:8>. Upon receiving a power-on-reset signal on line POR from reset logic 200, configuration state machine 120 conventionally loads program data from flash memory array 310 into corresponding configuration bit cells in RAM array 330, thereby configuring PLD 100 to provide selected logic functions. PLD 100 then enters the "active" mode, in which PLD 100 is an operational logic device.

Test ROM 140 is a conventional NAND decoder that receives four-bit parallel test instructions on terminals T0, T1, T2, and T3. Test ROM 140 includes a test-mode-enable latch 142 connected to a high-voltage-level input terminal $V_{PHH}$, which is used by test engineers to initiate test operations for PLD 100. Test ROM 140 becomes active when the voltage level on terminal $V_{PHH}$ is raised above an internal reference voltage of e.g. ten volts, or when a test instruction is applied to JTAG test enable line JTE via JTAG test circuitry 180. Either of these actions sets internal test-mode-enable latch 142, thereby enabling test ROM 140 to receive commands on terminals T0-T3. Test-mode-enable latch 142 remains set until PLD 100 is powered down or a power-on-reset signal is applied to line POR.

Test ROM 140 decodes test instructions on test terminals TS0-TS3, causing PLD 100 to enter one of several test "modes." Of the available test modes, an explanation of only one of them is necessary to describe the present invention. This mode, the test-power-on-reset mode, is used to reset and reconfigure PLD 100 without the relatively long delay associated with a power-on-reset (i.e., a reset initiated by interrupting power to PLD 100). For a detailed explanation of additional test modes, see the commonly owned U.S. patent application entitled "Wordline Driver For Flash PLD," by Napoleon W. Lee, Derek R. Curd, Wei-Yi Ku, Sholeh Diba, and George H. Simmons, Ser. No. 08/533,412, filed 25 Sep. 1995 (attorney docket number X-181, which is incorporated herein by reference.

When a test-power-on-reset instruction ms applied to terminals T0-T3, test ROM 140 decodes the instruction and provides a logic one on line TPOR. In response to the signal on line TPOR, reset logic 200 outputs a ten-microsecond (in one embodiment) logic-one pulse on power-on-reset line POR. In response to the power-on-reset signal, configuration state machine 120 loads program data from a flash memory array into corresponding configuration bit cells in a RAM array, thereby configuring PLD 100 to provide selected logic functions. The power-on-reset signal also resets test ROM 140 by resetting test-mode-enable latch 142 and resetting four input latches (not shown) that are conventionally configured to receive and store test input signals from terminals T0-T3.

$V_{CC}$ detector 160 is connected between terminal $V_{CC}$ and reset logic 200. During power up, $V_{CC}$ detector 160 conventionally signals a global reset on line JPOR for an approximately ten microseconds $V_{CC}$-invalid period. Reset logic 200 responds to the global reset signal on line JPOR by signaling a power-on-reset on line POR, thereby resetting configuration state machine 120 and test ROM 140. Reset logic 200 also conveys the global reset signal on line JPOR to memory array 300, which consequently resets JTAG test circuitry 180 by providing a JTAG-reset signal on a JTAG-reset line JTAG_RST. At the falling edge of the reset signal on line POR, configuration state machine 120 begins configuring memory array 300. Upon completion of the configuration, configuration state machine 120 issues a preload command on line PRLD to prepare reset logic 200 for subsequent reset instructions, as discussed below in connection with FIG. 2A.

A user can reset PLD 100 by providing a serial reset instruction on a designated input line of JTAG test-access port TAP. In response to the reset instruction, JTAG test circuitry 180 generates a reset request signal (logic one) on line IPOR. Reset logic 200 responds to the reset request signal on line IPOR by providing a power-on-reset signal on line POR. As was the case when a reset was requested through test ROM 140 or instigated by $V_{CC}$ detector 160, the end of the power-on-reset signal resets configuration state machine 120 and initiates a configuration of memory array 300. However, unlike resets requested through test ROM 140 or instigated by $V_{CC}$ detector 160, resets requested via JTAG test circuitry 180 do not result in a reset signal on line JPOR; consequently, no JTAG-reset signal is developed on line JTAG_RST, and JTAG test circuitry 180 remains active. Thus, a reset instruction entered via test-access-port TAP does not cause a reset of JTAG test circuitry 180, but does initiate a reset and reconfiguration of the non-JTAG circuitry on PLD 100.

Figure 2A:
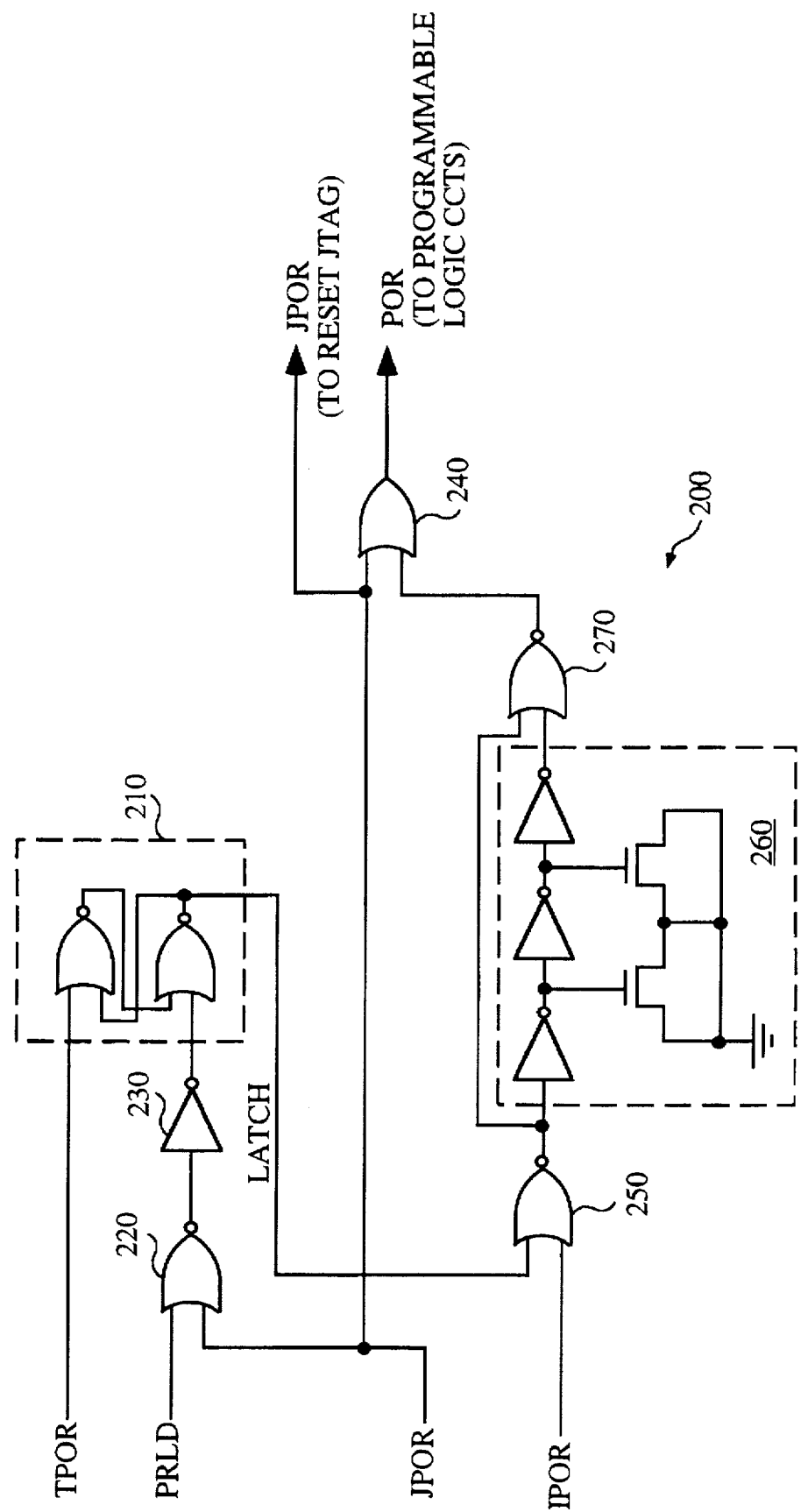
FIG. 2A is a schematic diagram of reset logic 200, including the input and output nodes shown in FIG. 1.

FIG. 2A is a schematic diagram of reset logic 200, including the input and output nodes shown in FIG. 1. Line TPOR from test ROM 140 is connected to one input terminal of a conventional cross-coupled latch 210. Without latch 210, the input signal to NOR gate 250 would, by initiating a power-on-reset signal on line POR to test ROM 140, almost immediately reset itself, resulting in an unacceptably short power-on-reset period. (Unlike the signal on line TPOR, the signal on line IPOR is not reset by feedback on line POR, and so does not require a latch to maintain the input signal to NOR gate 250 high during the power-on-reset period.) The other input terminal of latch 210 is connected to line PRLD from configuration state machine 120 via a NOR gate 220 and an inverter 230. Line JPOR from $V_{CC}$ detector 160 is connected to a second input terminal of NOR gate 220 and to an input terminal of OR gate 240.

A NOR gate 250 has one input terminal coupled to the output terminal of latch 210 and a second input terminal coupled to the JTAG test circuitry 180 via line IPOR. The output of NOR gate 250 is coupled both directly and through a conventional delay circuit 260 to input terminals of another NOR gate 270. Finally, the output of NOR gate 270 is coupled to a second input terminal of OR gate 240.

Delay circuit 260 establishes the time period $T_{DLY}$ of the power-on-reset signal initiated by either test ROM 140 (via TPOR) or JTAG test circuitry 180 (via IPOR). This delay $T_{DLY}$ is set to e.g. approximately ten microseconds, ensuring a complete reset of PLD 100. The delay $T_{DLY}$ imposed by delay circuit 260 is not required for line JPOR, because $V_{CC}$ detector 160 (see FIG. 1) holds the signal on line JPOR high for approximately ten microseconds after PLD 100 is powered up.

Figure 2B:
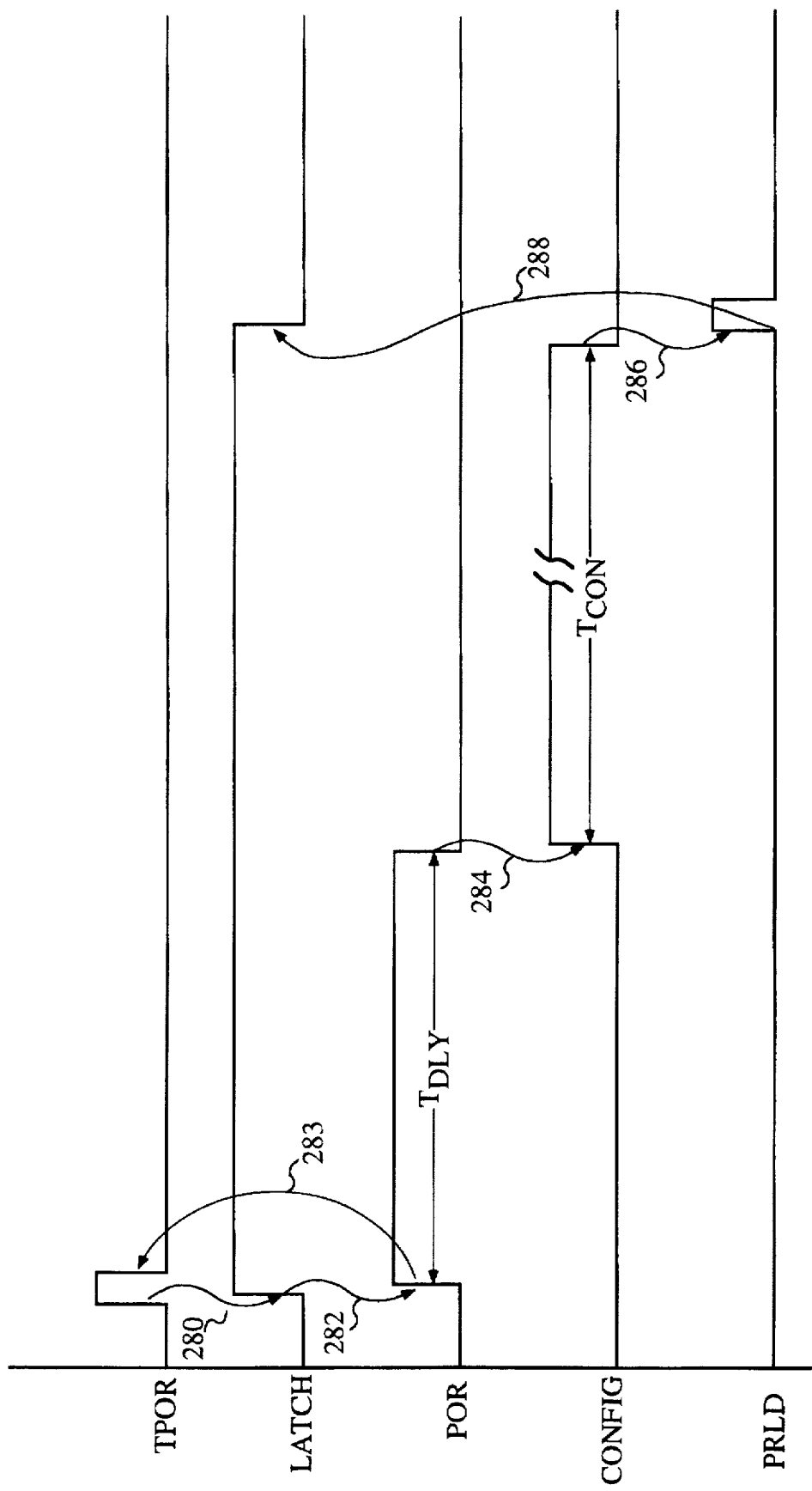
FIG. 2B is a waveform diagram illustrating some of the signals associated with various nodes of FIG. 2A.

FIG. 2B is a waveform diagram illustrating some of the signals associated with various lines of FIG. 2A. More particularly, FIG. 2B illustrates the process of resetting PLD 100 of FIG. 1 using a reset instruction from test ROM 140 via line TPOR. Such a reset instruction is developed by test ROM 140 when a reset test instruction is applied to test terminals TS0–TS3.

Referring to both FIG. 2A and FIG. 2B, the low-to-high transition on line TPOR (i.e., from a logic zero to a logic one) causes the output signal of latch 210 to transition low to high, illustrated by arrow 280 in FIG. 2B. As indicated by a second arrow 282, when the signal on line LATCH goes high, the power-on-reset signal on line POR also goes high after a short delay imposed by the inherent combined delays of NOR gate 250, NOR gate 170, and OR gate 240. The signal on line POR resets the four input latches (not shown) of test ROM 140 connected to terminals T0–T3 before returning low after the ten-microsecond delay period $T_{DLY}$ imposed by delay circuit 260.

When the four input latches of test ROM 140 are reset by a logic one on line POR, the signal on line TPOR returns to a logic zero (see arrow 283). For this reason, latch 210 is provided to stretch the duration of the input signal applied to NOR gate 250.

As illustrated by arrow 284, configuration state machine 120 begins to configure memory array 300 at the falling edge of the reset signal on line POR. This configuration period $T_{CON}$ (i.e., the conload period) continues until memory array 300 is fully configured (approximately 100 microseconds). The waveform "Config" depicted in FIG. 2B does not correspond to a node on FIG. 2A, but instead illustrates the timing of the configuration period $T_{CON}$.

An arrow 286 shows that after memory array 300 is fully configured, configuration state machine 120 issues a preload command on line PRLD. Finally, as illustrated by arrow 288, the preload signal on line PRLD resets latch 210 through NOR gate 220 and inverter 230 to prepare latch 210 for subsequent reset instructions on line TPOR.

Importantly, reset signals on either of lines TPOR and IPOR cause a reset and reconfiguration of PLD 100 without resetting JTAG test circuitry 180. In contrast, powering up PLD 100 initiates a global reset signal on line JPOR that resets PLD 100 in its entirety, including a reset of JTAG test circuitry 180.

Figure 3:
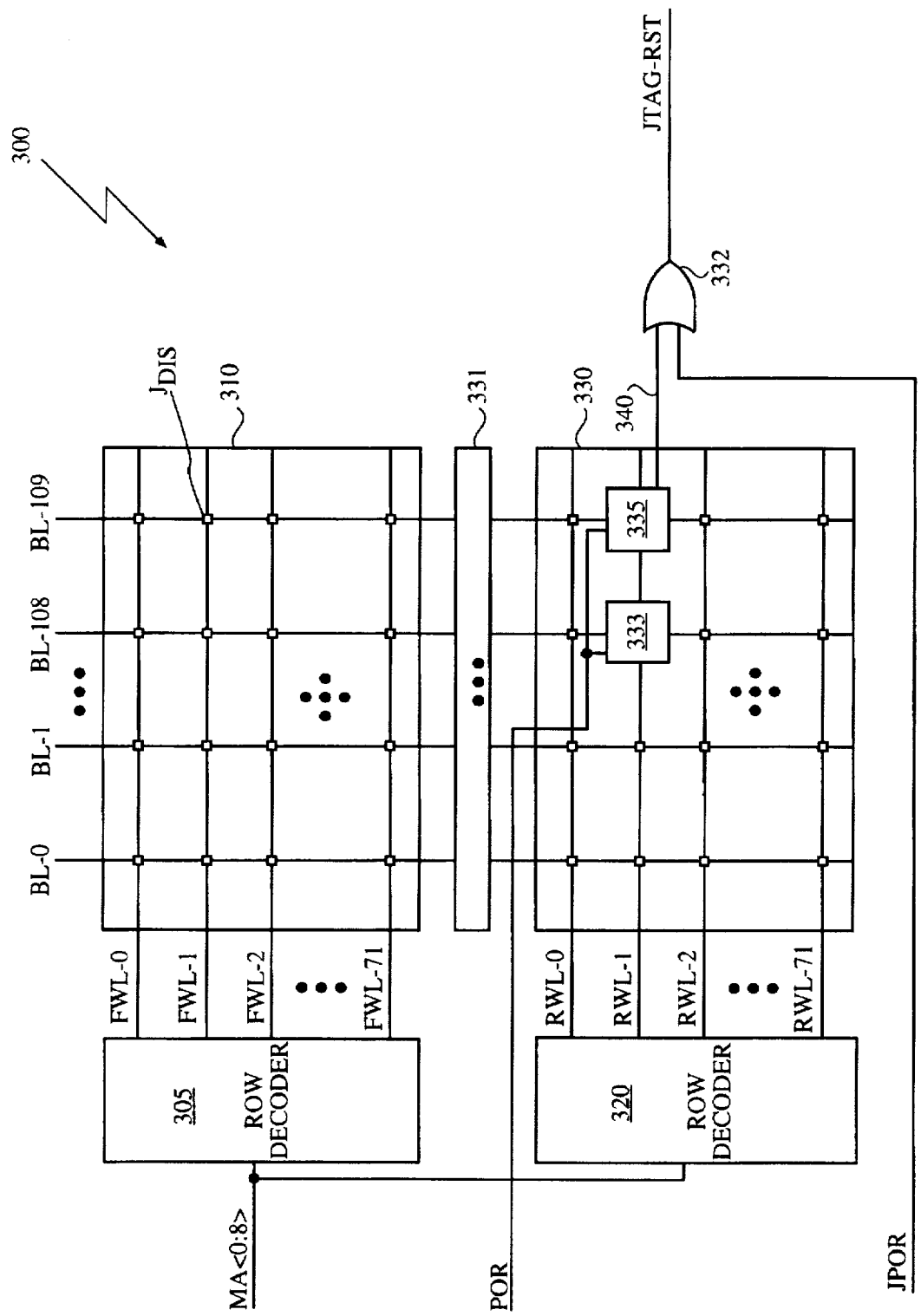
FIG. 3 is a schematic diagram of memory array 300.

FIG. 3 is a schematic diagram of memory array 300, which includes the following conventional components: a flash-array row decoder 305, a flash array 310, a RAM row decoder 320, a RAM array 330, and a sense-amplifier array 331. In accordance with the present invention, memory array 300 also includes an OR gate 332 configured (as explained below) to selectively disable JTAG test circuitry 180.

Row decoders 305 and 320 each receive the same address signals from configuration state machine 120 via memory-array bus MA<0:8>. To configure memory array 300, configuration state machine 120 provides a series of addresses to row decoders 305 and 320, sequentially stepping through each of flash wordlines FWL__0 through FWL__71 while simultaneously stepping through corresponding RAM wordlines RWL__0 through RWL__71. As each pair of wordlines is selected (e.g., FWL__0 and RWL__0), the logic state of each flash storage cell is read into a corresponding configuration bit cell ("CB cell") in RAM array 330, there being one CB cell for each wordline/bitline intersection (i.e., each flash storage cell) in RAM array 330. Two CB cells 333 and 335 are shown enlarged for illustrative purposes.

Sense-amplifier array 331 receives the signals on bitlines BL__0 through BL__109 and provides restored logic levels of approximately zero and five volts to RAM array 330. The process of configuring a memory array by transferring information stored in a flash array to a RAM array is well known.

Each CB cell within RAM array 330 (as shown for CB cells 333 and 335) is connected to line POR so that the CB cells are erased (i.e., set to store a logic zero) by the logic one power-on-reset signal on line POR. Because configuration state machine 120 begins configuring memory array 300 at the falling edge of the power-on-reset signal, the CB cells are erased before configuration state machine 120 begins sequencing through memory array 300.

A portion of flash memory array 310 includes flash memory cells that may not be programmed or read by a "user" (e.g., a circuit designer). One such flash memory cell, a JTAG-disable cell $J_{DIS}$, is programmed by e.g. the manufacturer of PLD 100 to load a logic one into the corresponding CB cell 335. Thus configured, CB cell 335 provides a logic one on JTAG-reset line JTAG__RST via a line 340 and OR gate 332. The logic one on line JTAG__RST disables JTAG test circuitry 180 by forcing it into a permanent reset state without affecting the functionality of the remaining circuitry of PLD 100. This ability to selectively disable JTAG test circuitry 180 is useful e.g. when the JTAG circuitry is defective.

Figure 4:
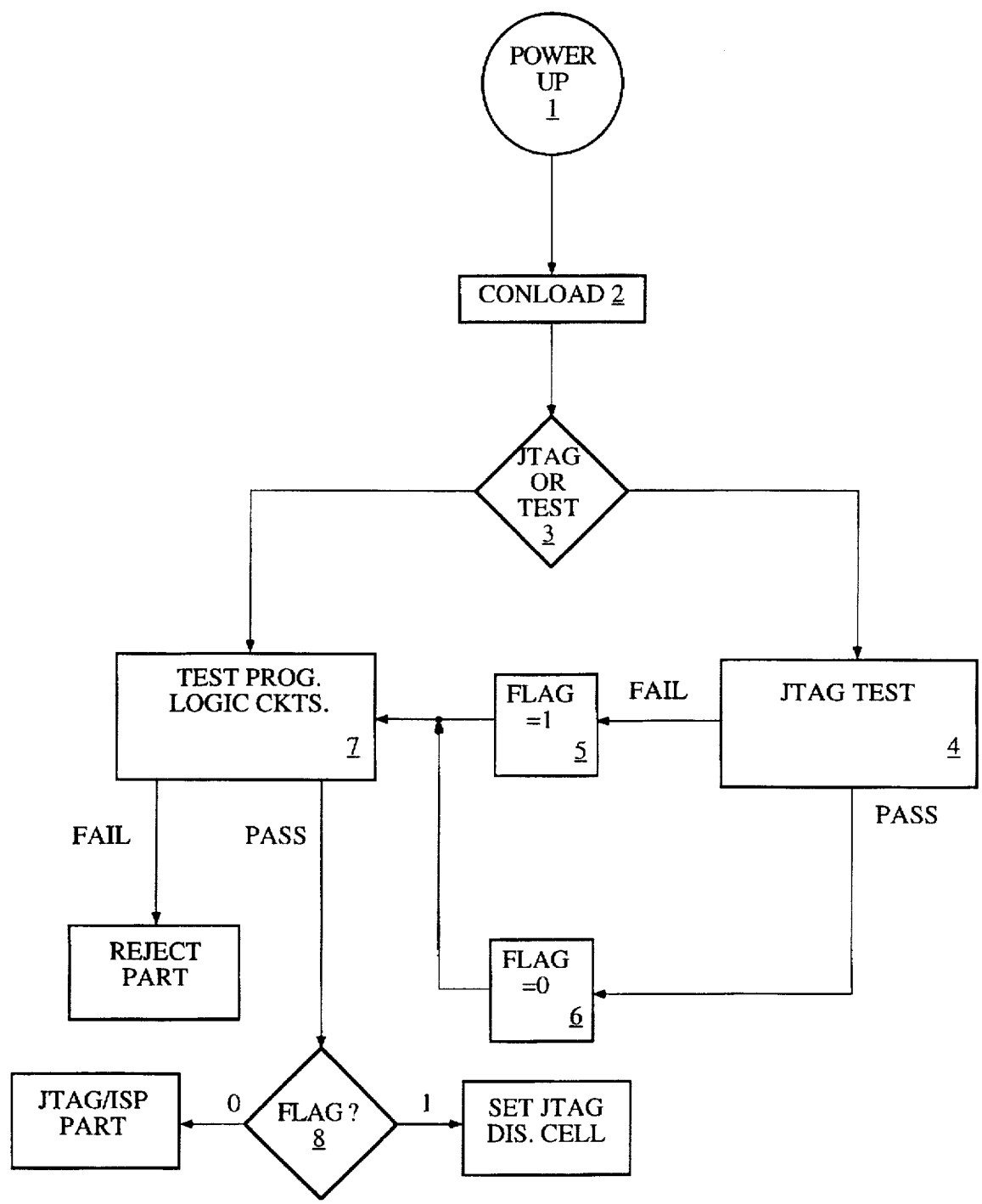
FIG. 4 is a flow chart illustrating a test flow for PLD 100.

FIG. 4 is a flow chart that illustrates the flow of a computer test program used to test PLD 100. To test the integrity of PLD 100, a test engineer connects PLD 100 to a conventional dedicated PLD tester (not shown). The tester is controlled by the computer test program of FIG. 4 to provide predetermined test vectors (i.e., combinations of input signals) to terminals of PLD 100 and to compare the resulting output signals from PLD 100 to a library of expected data.

At step 1, "power up," power is applied to the IC device. $V_{CC}$ detector 160 responds to the applied power by providing a logic one on terminal JPOR, thereby initiating a global reset of PLD 100. The logic one on terminal POR causes configuration state machine 120 to configure PLD 100, as indicated in FIG. 4 by step 2, "CONLOAD." Steps 1 and 2 are performed each time PLD 100 is powered up, whether by a manufacturer, a test engineer, or an end user.

As indicated by the decision block 3, the test program may be configured to first test either the programmable logic circuitry (i.e., standard functional circuitry), or JTAG test circuitry 180. In the following example, the test program tests JTAG test circuitry 180 first. Thus, in decision block 3 the test program issues JTAG test instructions, moving the test flow to JTAG-test step 4.

In step 4, the test program tests the integrity of JTAG test circuitry 180 by issuing various JTAG-supported instructions (i.e., test vectors) through the JTAG test-access port (TAP) of FIG. 1 and comparing the resulting output signals with expected output signals. Should the expected output signals fail to match the actual output signals, the test program transitions to step 5, setting a fail flag (e.g. a variable defined in the test program) to a logic one. If, on the other hand, all of the actual output signals match the expected output signals, the test program transitions to step 6 and sets the fail flag to a logic zero.

From either of steps 5 or 6, the test program continues on to step 7, "TEST PROG. LOGIC CKTS," in which the test program tests the functionality of the programmable logic circuitry (i.e., non-JTAG circuitry) of PLD 100 by initiating one or more conventional tests supported by test ROM 140. In shifting to step 7, the test program activates test ROM 140 by raising the voltage on terminal $V_{PHH}$ (as discussed above in connection with FIG. 1). Next, the test program applies one or more conventional test vectors to input terminals of PLD 100 to determine whether PLD 100 functions properly as a complex PLD. For a detailed explanation of the types of tests used to verify the operation of PLD 100, see the aforementioned patent application entitled "Wordline Driver For Flash PLD."

One important test instruction available in step 7 allows PLD 100 to be reset and reconfigured using a test instruction to test ROM 140. This ability to reset and reconfigure PLD 100 using instructions to test ROM 140 is advantageous because the reset instruction supported by JTAG test circuitry 180 cannot be used if JTAG-test circuitry 180 is disabled, and the other reset method, interrupting power to $V_{CC}$ detector 160, is relatively time consuming.

Should PLD 100 fail step 7, the test program classifies PLD 100 as a complete reject. If, however, PLD 100 should pass step 7, the test program moves to step 8 in which the fail flag of steps 5 and 6 is used to classify PLD 100. If the fail flag is set to a logic zero (indicating that JTAG test circuitry 180 is fully-functional), PLD 100 is classified as a fully-functional, JTAG-compatible PLD; conversely, if the fail flag is set to a logic one (indicating that JTAG test circuitry 180 is defective) PLD 100 is classified as a standard, non-JTAG-compatible PLD and JTAG-disable cell $J_{DIS}$ (of FIG. 3) is programmed to store a logic one. Because flash memory cells are nonvolatile, programming JTAG-disable cell $J_{DIS}$ forces JTAG test circuitry 180 to remain reset (i.e., disabled) regardless of whether power is applied to PLD 100. Of course, JTAG test circuitry 180 can be disabled though not defective if, for example, a manufacturer wishes to manufacture a single type of PLD die and still support a differential price scheme that depends upon JTAG compatibility.

Figure 5:
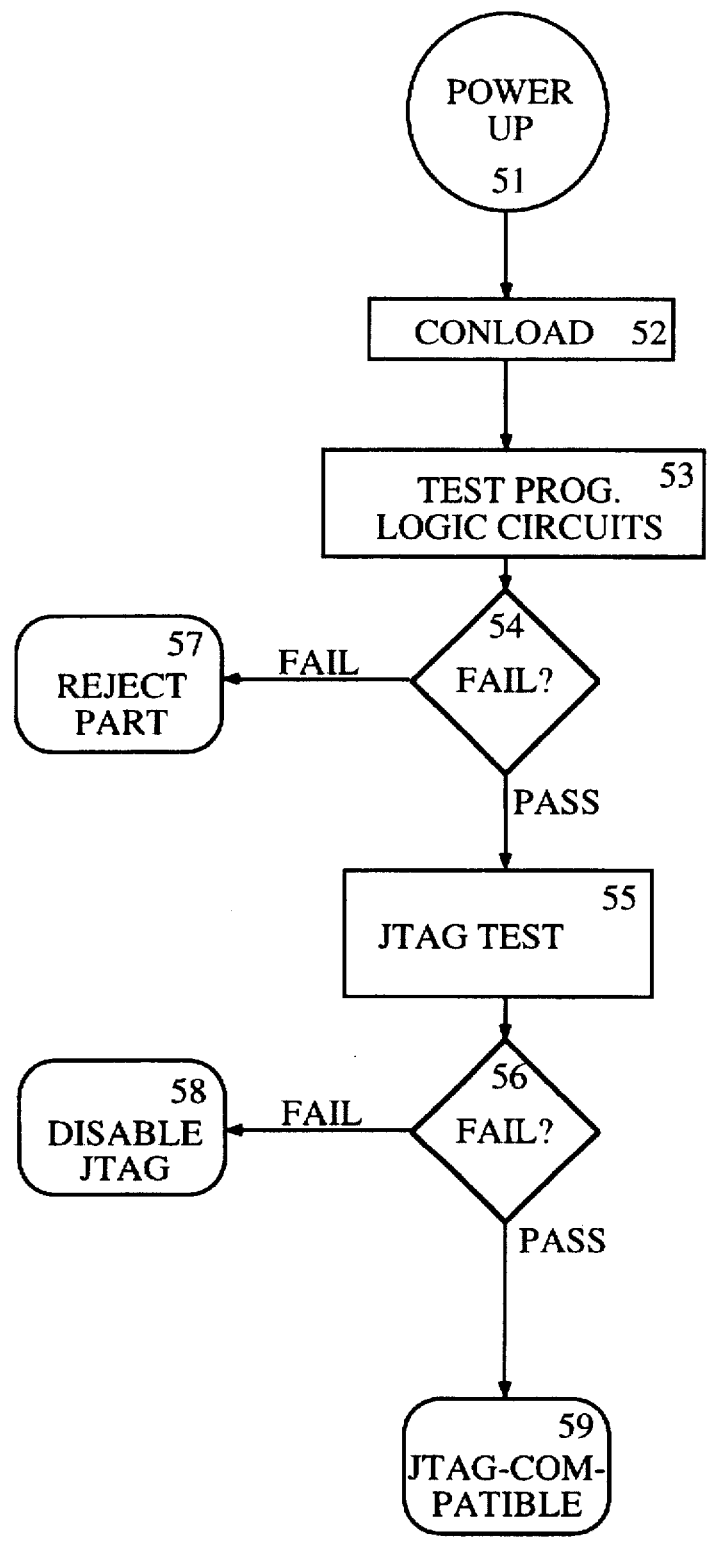
FIG. 5 shows another test flow for PLD 100.

FIG. 5 shows another flow chart usable with the invention. Power-up step 51 and conload step 52 are as in FIG. 4. However, in step 53 the programmable logic circuits are tested first. Then, if step 54 indicates that the logic circuit tests of step 53 fail, the flow moves to step 57 in which PLD 100 is rejected, thus saving the time of JTAG testing. If step 54 indicates that the programmable logic circuit tests pass, the flow moves, at step 55, to JTAG testing. If step 56 indicates that JTAG test circuitry 180 is defective, the flow moves to step 58 in which JTAG test circuitry 180 is disabled and PLD 100 is sold as a standard PLD without the JTAG compatibility. If both tests pass, at step 59 JTAG test circuitry 180 is not disabled and the PLD 100 is sold as JTAG compatible.

The above description is illustrative and not limiting. Further modifications of the above-described invention will be apparent to those skilled in the art. For example, whereas the above-described embodiment allows PLD 100 to be reset using a test instruction through test ROM 140, a separate reset terminal could be added to PLD 100 to provide a reset in the event that JTAG test circuitry 180 is defective. Such variations fall within the scope of the appended claims.

What is claimed is:

1. An integrated circuit comprising:

a JTAG instruction port;

JTAG circuitry having a first input node connected to the instruction port and a second input node; and programmable memory including a programmable JTAG-disable-bit storage location connected to the second input node of the JTAG circuitry.

2. The integrated circuit of claim 1, further comprising test circuitry for resetting the integrated circuit in response to an external test command, the test circuitry comprising:

a test-instruction input node configured to receive the external test command; and a reset node connected to the programmable memory;

wherein the test circuitry develops a reset signal on the reset node in response to the external test command.

3. The integrated circuit of claim 2, further comprising:

a power-supply input terminal for receiving power from an external power supply; and power-on-reset circuitry having an input terminal connected to the power-supply input terminal and an output terminal connected to the programmable memory, the power-on-reset circuitry resetting the integrated circuit in response to fluctuations in the power from the external power supply.

4. The integrated circuit of claim 3, further comprising:

configurable memory connected to the programmable memory; and a configuration state machine connected to the programmable memory and the configurable memory, the state machine for loading the configurable memory with data from the programmable memory.

5. The integrated circuit of claim 4, wherein the configurable memory includes an array of RAM cells and the programmable memory is an array of flash memory cells.

6. A method of testing an integrated circuit, wherein the integrated circuit includes functional circuitry and JTAG circuitry, the method comprising the steps of:

testing the JTAG circuitry;

testing the functional circuitry; and if the steps of testing the JTAG circuitry and the functional circuitry indicate that the JTAG circuitry is not operational and the functional circuitry is operational, disabling the JTAG circuitry.

7. The method of claim 6, wherein the functional circuitry includes programmable logic.

8. The method of claim 6, wherein the integrated circuit further comprises a programmable JTAG-disable-bit storage location that, when programmed, disables the JTAG circuitry, the method further comprising programming the JTAG-disable-bit storage location if the JTAG circuitry is not operational and the functional circuitry is operational.

9. An integrated circuit comprising:

JTAG circuitry;

a programmable JTAG-disable-bit storage location for selectively disabling the JTAG circuitry;

means for testing the JTAG circuitry to determine whether the JTAG circuitry is defective; and means for programming the JTAG-disable-bit storage location if the means for testing detects a defect, thereby disabling the JTAG circuitry.

10. A structure for testing JTAG and logic circuits, the structure comprising:

a logic circuit structure;

a JTAG test structure;

means for resetting the logic circuit structure in response to a logic reset signal and a JTAG reset signal; and means for disabling the JTAG test structure in response to the JTAG reset signal.

* * * * *